United States Patent
Fernandez et al.

(10) Patent No.: US 11,781,435 B2
(45) Date of Patent: Oct. 10, 2023

(54) BIFURCATED FABRIC ARCHITECTURE FOR AIRFOILS, METHODS OF MANUFACTURE THEREOF AND AIRFOILS COMPRISING THE SAME

(71) Applicant: RTX Corporation, Farmington, CT (US)

(72) Inventors: Robin H. Fernandez, East Haddam, CT (US); John D. Riehl, Hebron, CT (US); Aaron Tomich, Mansfield, MA (US); Steven R. Clarke, Mansfield, MA (US)

( * ) Notice: Subject to any disclaimer, the term of this patent is extended or adjusted under 35 U.S.C. 154(b) by 0 days.

(21) Appl. No.: 17/682,674

(22) Filed: Feb. 28, 2022

(65) Prior Publication Data
US 2023/0272720 A1    Aug. 31, 2023

(51) Int. Cl.
*F01D 5/28* (2006.01)
*F01D 5/14* (2006.01)
*C23C 16/04* (2006.01)

(52) U.S. Cl.
CPC .............. *F01D 5/282* (2013.01); *F01D 5/147* (2013.01); *C23C 16/045* (2013.01); *F05D 2230/50* (2013.01); *F05D 2300/6033* (2013.01)

(58) Field of Classification Search
CPC ... F01D 5/282; F01D 5/284; F05D 2300/6033
See application file for complete search history.

(56) References Cited

U.S. PATENT DOCUMENTS

| | | | |
|---|---|---|---|
| 6,196,794 B1* | 3/2001 | Matsumoto | B29C 66/543 416/241 A |
| 9,011,085 B2 | 4/2015 | Suciu et al. | |
| 9,103,214 B2* | 8/2015 | McCaffrey | F01D 9/041 |
| 9,308,708 B2* | 4/2016 | Kleinow | B32B 18/00 |
| 9,427,834 B2 | 8/2016 | Fremont et al. | |
| 10,724,387 B2 | 7/2020 | Farrar et al. | |
| 10,800,128 B2* | 10/2020 | Feie | B29C 66/1228 |
| 11,035,239 B2 | 6/2021 | De Diego et al. | |
| 2007/0160466 A1 | 7/2007 | Keller | |
| 2011/0206522 A1 | 8/2011 | Alvanos et al. | |
| 2019/0390555 A1* | 12/2019 | Kline | F01D 5/282 |
| 2020/0392049 A1 | 12/2020 | Razzell et al. | |
| 2021/0164352 A1 | 6/2021 | Backhouse et al. | |

FOREIGN PATENT DOCUMENTS

| | | |
|---|---|---|
| EP | 2562360 A2 | 2/2013 |
| EP | 3564488 A1 | 11/2019 |

OTHER PUBLICATIONS

Extended European Search Report for EP Application No. 23158883.1; Report dated Jul. 14, 2023, 9 pages.

\* cited by examiner

*Primary Examiner* — Michael L Sehn
(74) *Attorney, Agent, or Firm* — CANTOR COLBURN LLP

(57) ABSTRACT

Disclosed herein is a ceramic matrix composite airfoil comprising a triple bifurcated ply that defines a suction side, an outer platform, a pressure side and an inner platform of the airfoil, wherein the triple bifurcated ply comprises at least one ply that comprises a consolidated region, wherein the consolidated region is split into two bifurcated regions in three locations in three different directions.

20 Claims, 6 Drawing Sheets

BIFURCATED FABRIC ARCHITECTURE FOR AIRFOILS, METHODS OF MANUFACTURE THEREOF AND AIRFOILS COMPRISING THE SAME

BACKGROUND

This disclosure is related to bifurcated fabric architectures for use in ceramic matrix composites. In particular, this disclosure relates to bifurcated fabric architectures for use in airfoils, methods of manufacture thereof and articles comprising the same.

Integrating airfoil plies into an inner diameter (ID) and/or an outer diameter (OD) platform is important from a structural perspective. The details and inherent trade-offs challenge both the part designer and manufacturer. Historically, this has been accomplished with "tabs" cut into the ply flat pattern that fold either to the pressure side or suction side of the airfoil. Typically, one layer's tab would fold to one side and the subsequent layer's tab would fold the opposite direction. A "noodle", or gap filler, was necessary to fill the region between the diverging tabs. Using this approach, lamina continuity between airfoil sides is often adversely impacted. In addition, the void filling ability of the noodle is not always as efficient or as desirable as it should be.

SUMMARY

Disclosed herein is a ceramic matrix composite airfoil comprising a triple bifurcated ply that defines a suction side, an outer platform, a pressure side, and an inner platform of the airfoil, wherein the triple bifurcated ply comprises at least one ply that comprises a consolidated region, wherein the consolidated region is split into two bifurcated regions in three locations in three different directions.

In an embodiment, the consolidated region comprises a plurality of plies in addition to the at least one ply.

In another embodiment, the three different directions are at angles of 30 to 150 degrees to one another.

In yet another embodiment, an innermost ply is directly adjacent a central airfoil axis to form a solid airfoil.

In yet another embodiment, at least one split is oriented at right angles to another split.

In yet another embodiment, the three different directions are all at right angles to at least one other direction.

In yet another embodiment, the splits are symmetrical about a plane or an axis.

In yet another embodiment, the splits are asymmetrical about a plane or an axis through the consolidated region.

In yet another embodiment, at least one of the bifurcations defines the suction side and the pressure side of the airfoil.

In yet another embodiment, at least one of the bifurcations defines the inner diameter of the airfoil.

In yet another embodiment, at least one of the bifurcations defines the outer diameter of the airfoil.

In yet another embodiment, at least two directions are parallel to one another and wherein at least two directions are perpendicular to other direction.

In yet another embodiment, the consolidated region is two times as thick as each bifurcated region.

Disclosed herein is a method for manufacturing a ceramic matrix composite airfoil comprising splitting one or more consolidated plies into two bifurcated regions in at least three different directions to form an initial preform; optionally add additional plies to the initial preform to form a final preform; where the bifurcated directions define the pressure side, the suction side, the inner diameter and outer diameter platforms of the airfoil; and subjecting the final preform to chemical vapor infiltration, polymer infiltration pyrolysis, melt infiltration, or a combination thereof to form the ceramic matrix composite.

In yet another embodiment, at least two directions are parallel to one another and wherein at least two directions are perpendicular to other direction.

In yet another embodiment, the three different directions are at angles of 30 to 150 degrees to one another.

In yet another embodiment, an innermost ply is directly adjacent a central airfoil axis to form a solid airfoil.

In yet another embodiment, at least one split is oriented at right angles to another split.

In yet another embodiment, the three different directions are all at right angles to at least one other direction.

In yet another embodiment, at least one of the bifurcations defines the suction side and the pressure side of the airfoil.

DETAILED DESCRIPTION

Disclosed herein is a woven fabric architecture that comprises one consolidated region and three unique bifurcated regions used to form aft portions of the inner diameter (ID) and outer diameter (OD) platforms into a continuous piece of fabric with the pressure side and suction side of the airfoil. The consolidated region can comprise a single ply or a plurality of plies that can be bifurcated in three mutually perpendicular different regions to form the aft portions of the inner diameter (ID) and outer diameter (OD) platforms into a continuous piece of fabric with the pressure side and suction side of the airfoil.

The projected area of the consolidated region is largely rectangular in shape, and each bifurcated region originates on an edge of the consolidated region. When viewed from the side, the airfoil bifurcation originates on the 3 o'clock edge with one pressure side and one suction side bifurcation that are preferably at right angles to the airfoil bifurcation. Each airfoil bifurcation extends toward the leading edge of the airfoil. In an embodiment, the OD platform bifurcation originates on the 12 o'clock edge, and the ID platform bifurcation originates at the 6 o'clock edge. The ID and OD platform bifurcations extend away from the airfoil in the circumferential direction.

In an embodiment, a ceramic matrix composite airfoil comprises a triple bifurcated ply that defines a suction side, an outer platform, a pressure side and an inner platform of the airfoil, wherein the bifurcated ply comprises at least two plies that comprise a plurality of ceramic fibers.

Figure 1:
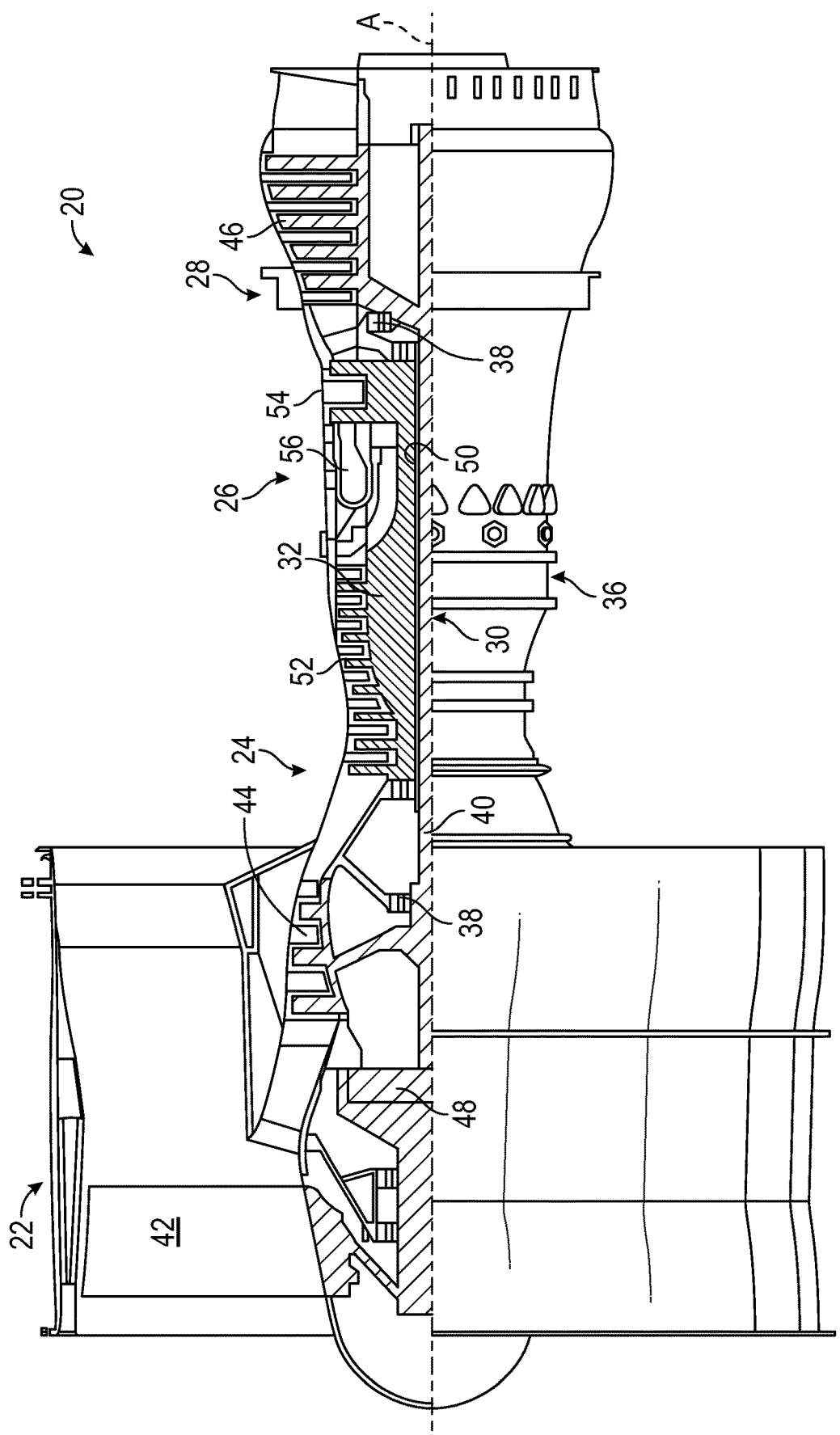
FIG. 1 schematically illustrates a gas turbine engine.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engines might include an augmentor section (not shown) among other systems or features. The fan section 22 drives air along a bypass flowpath while the compressor section 24 drives air along a core flowpath for compression and communication into the combustor section 26 then expansion through the turbine section 28. Although depicted as a turbofan gas turbine engine in the disclosed non-limiting embodiment, it should be understood that the concepts described herein are not limited to use with turbofans as the teachings may be applied to other types of turbine engines.

The engine 20 generally includes a low speed spool 30 and a high speed spool 32 mounted for rotation about an engine central longitudinal axis A relative to an engine static structure 36 via several bearing systems 38. It should be understood that various bearing systems 38 at various locations may alternatively or additionally be provided.

The low speed spool 30 generally includes an inner shaft 40 that interconnects a fan 42, a low pressure compressor 44 and a low pressure turbine 46. The inner shaft 40 is connected to the fan 42 through a geared architecture 48 to drive the fan 42 at a lower speed than the low speed spool 30. The high speed spool 32 includes an outer shaft 50 that interconnects a high pressure compressor 52 and high pressure turbine 54. A combustor 56 is arranged between the high pressure compressor 52 and the high pressure turbine 54. The inner shaft 40 and the outer shaft 50 are concentric and rotate about the engine central longitudinal axis A which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The turbines 54, 46 rotationally drive the respective low speed spool 30 and high speed spool 32 in response to the expansion.

Figure 2:
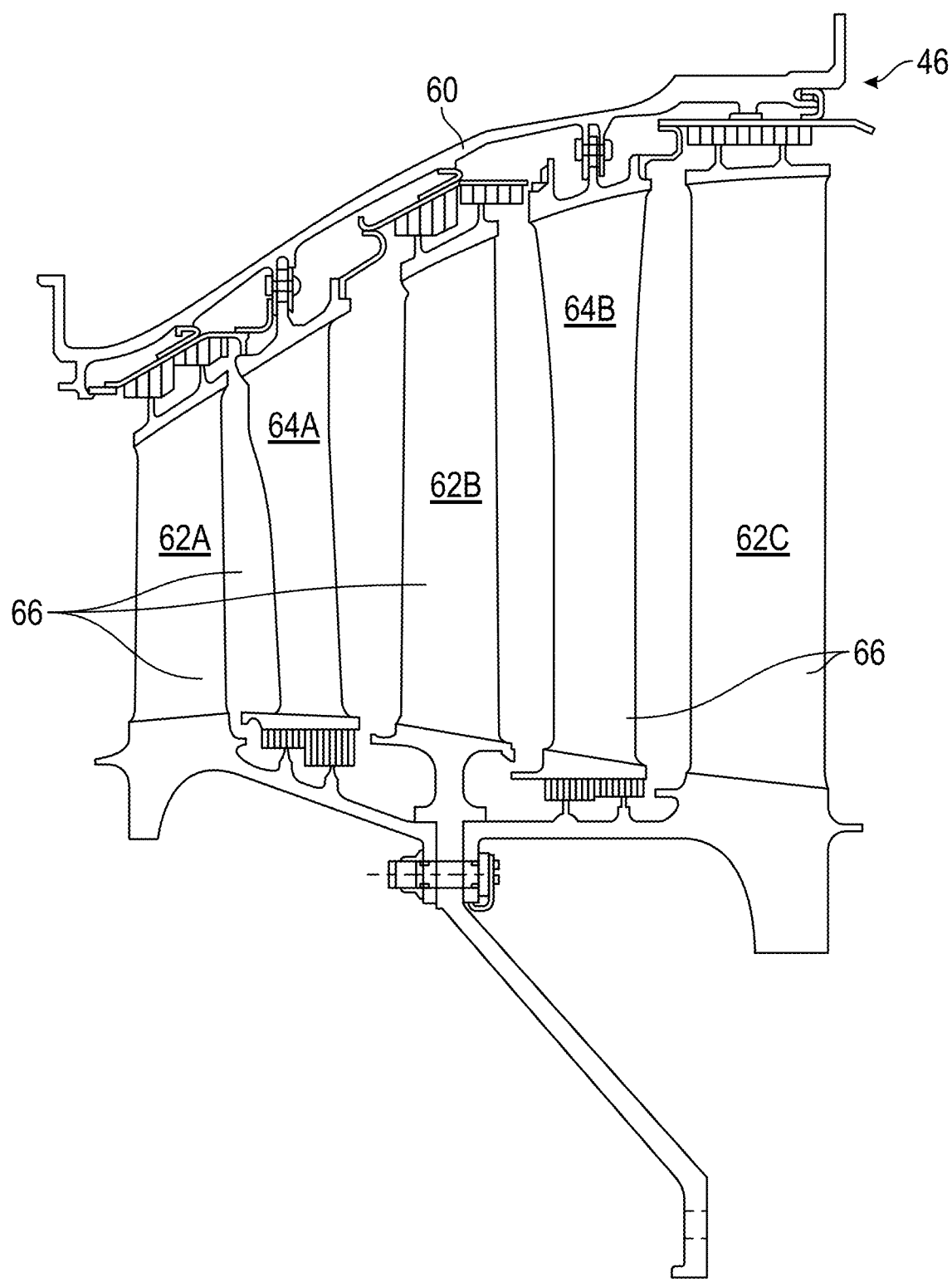
FIG. 2 is an enlarged sectional view of a low pressure turbine section of the gas turbine engine.
Figure 4:
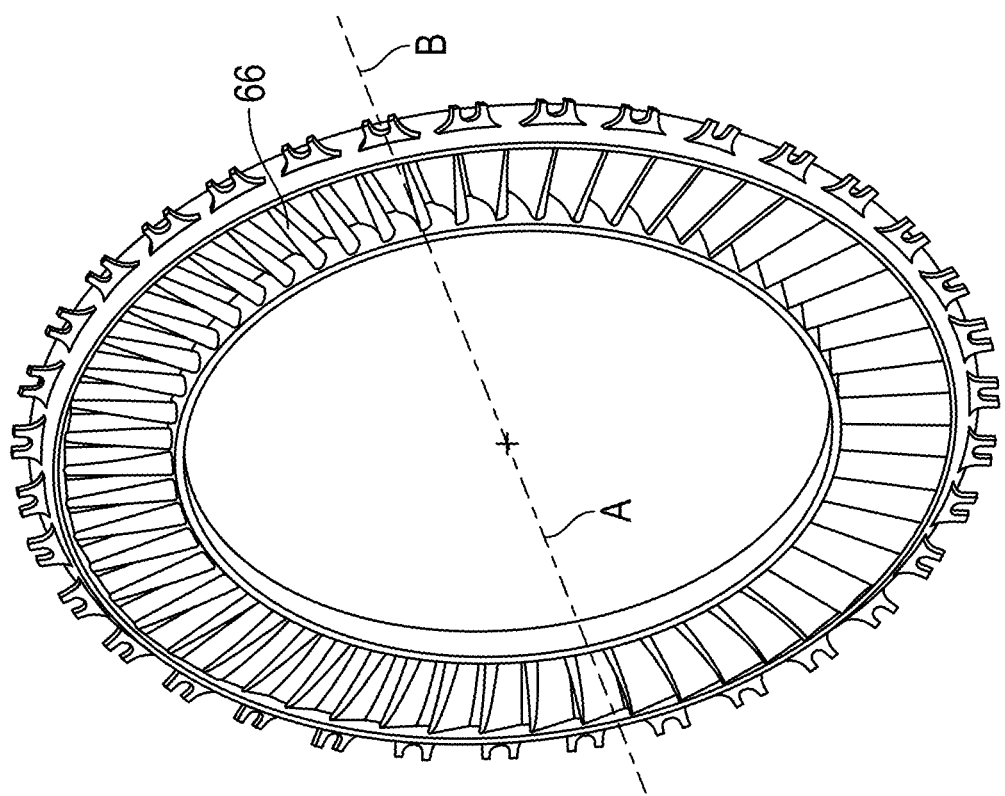
FIG. 4 is an enlarged perspective view of an example stator vane structure of the low pressure turbine section.
Figure 3:
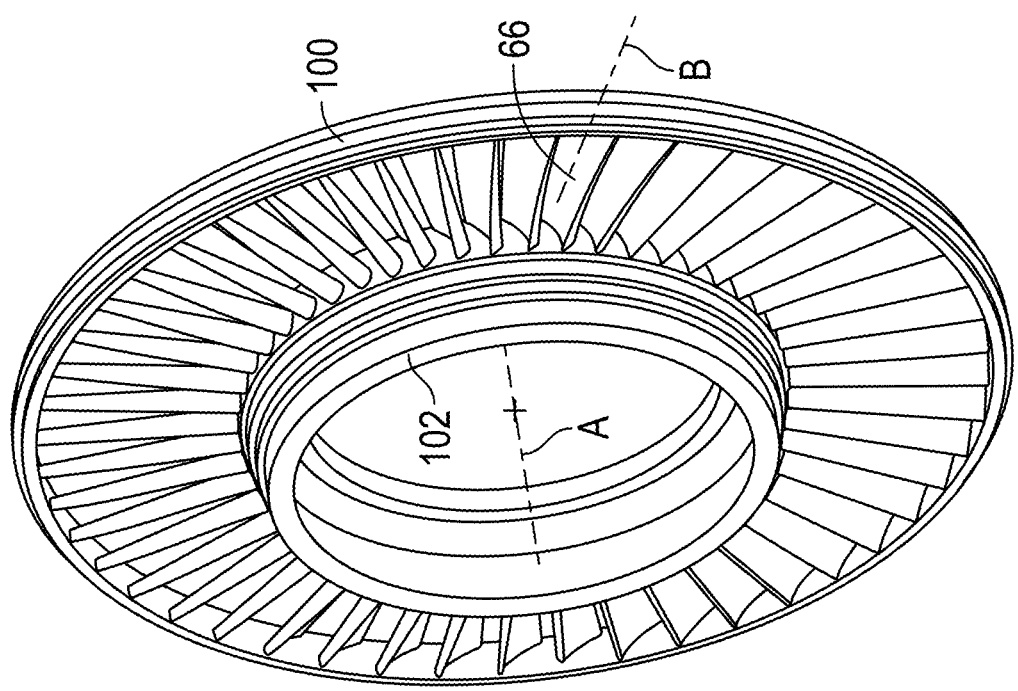
FIG. 3 is an enlarged perspective view of an example rotor disk of the low pressure turbine section.

With reference to FIG. 2, the low pressure turbine 46 generally includes a low pressure turbine case 60 with a multiple of low pressure turbine stages. The stages include a multiple of rotor structures 62A, 62B, 62C interspersed with vane structures 64A, 64B. Each of the rotor structures 62A, 62B, 62C and each of the vane structure 64A, 64B may include airfoils 66 manufactured of a ceramic matrix composite (CMC) material typically in a ring-strut-ring full hoop structure (FIGS. 3 and 4). It should be understood that the term full hoop is defined herein as an uninterrupted member such that the vanes do not pass through apertures formed therethrough. It should be also understood that examples of CMC material for all componentry discussed herein may include, but are not limited to, for example, SiC fibers (e.g., S200 (which is a type of silicon carbide (SiC) fiber)) with a SiC matrix.

Although depicted as a low pressure turbine in the disclosed embodiment, it should be understood that the concepts described herein are not limited to use with low pressure turbine as the teachings may be applied to other sections such as high pressure turbine, high pressure compressor, low pressure compressor and intermediate pressure turbine and intermediate pressure turbine of a three-spool architecture gas turbine engine.

Figure 5:
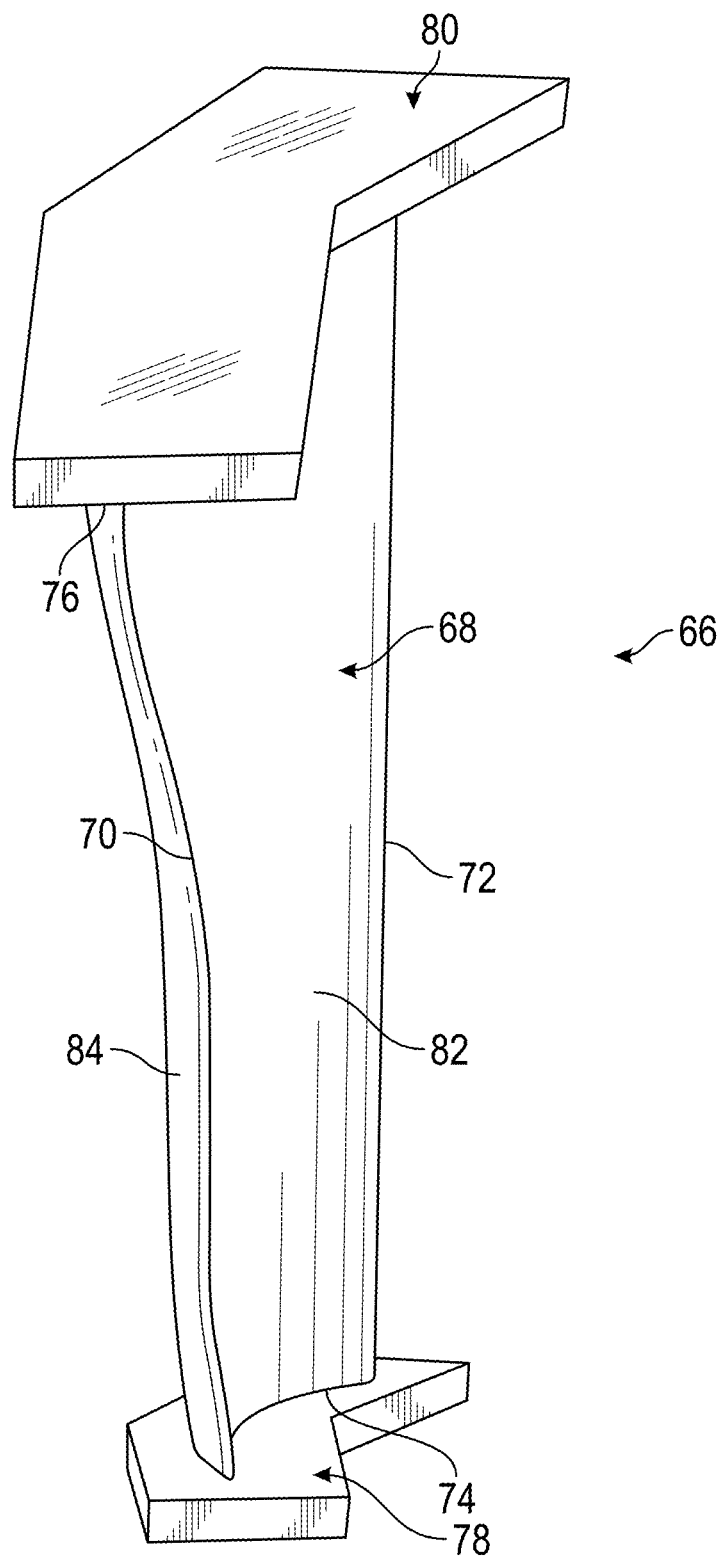
FIG. 5 is a perspective view of a CMC airfoil.

With reference to FIGS. 3, 4 and 5, one CMC airfoil 66 usable with a ring-strut-ring full hoop structure is illustrated. Although a somewhat generic airfoil 66 will be described in detail hereafter, it should be understood that various rotary airfoils or blades and static airfoils or vanes such as those within the low pressure turbine 46 may be particularly amenable to the fabrication described herein.

With reference now to the FIG. 5, the CMC airfoil 66 generally includes an airfoil portion 68 defined between a leading edge 70 and a trailing edge 72. The airfoil portion 68 includes a generally concave shaped portion which forms a pressure side 82 and a generally convex shaped portion which forms a suction side 84. Each airfoil 66 may include a fillet 74, 76 to provide a transition on each side of the airfoil portion 68 to a respective platform segment 78, 80. The platform segments 78, 80 form the inner diameter and outer diameter of the core gas path.

The fabrication of the CMC airfoil 66 in the disclosed non-limiting embodiment utilizes an "I"-shape fiber geometry (illustrated schematically in FIGS. 7 and 8 which are detailed later). This geometry facilitates the integrity of the individual fibers and allows the airfoil portion 68 to be robustly connected to the inner and outer platform segments 78, 80 in an integral manner. That is, the "I" shape geometry provides for continuity in the internal stress carrying CMC structural fibers to achieve maximum strength-to-weight as the airfoil portion 68 and platform segments are formed in a contiguous manner. It should be understood that various methods of CMC manufacturability are applicable.

By integrating the aft portions of the inner diameter 78 and outer diameter platforms 80 and bifurcated airfoil plies into one continuous shape, structural continuity in the region is maintained and the large voids created by the traditional approach are significantly limited or altogether removed. This single piece of triply bifurcated fabric can be incorporated into the laminate using normal techniques, and in doing so, eliminates numerous small details and processing steps.

Figure 6:
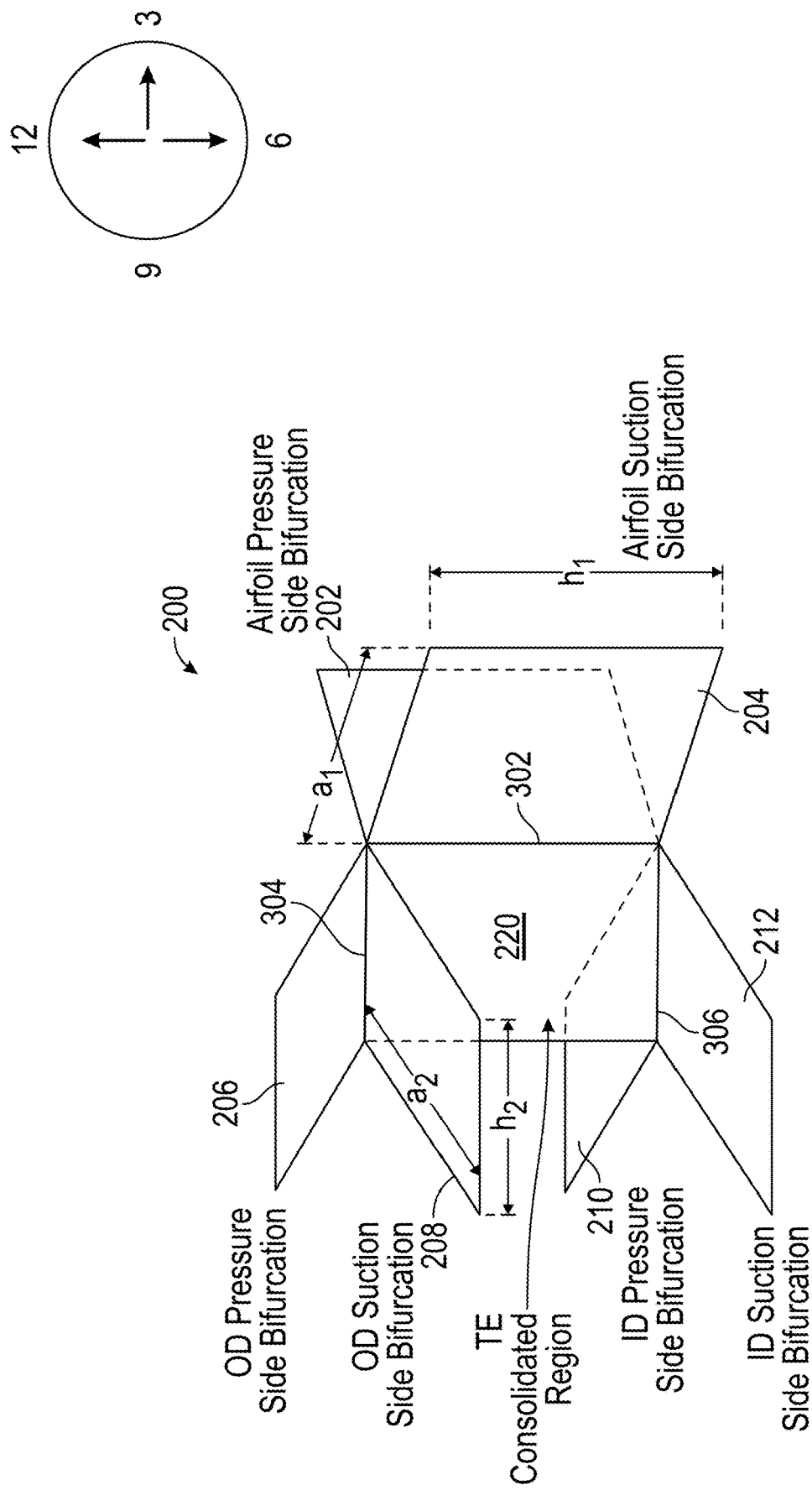
FIG. 6 is an exemplary depiction of a triple bifurcated ply.

FIG. 6 is used to depict two embodiments of the bifurcated ply 200. In a first embodiment, the triply bifurcated ply 200 comprises a consolidated region 220 that comprises a single ply that is bifurcated in three different directions as detailed below. The consolidated region 220 is woven as a single thick region (whose thickness can approximate a stack of individual plies), but this single ply having consolidated region 220 is split into two bifurcated parts in three mutually perpendicular directions. In an embodiment, each of the splits is mutually perpendicular to at least one another split. In an embodiment, all three splits are mutually perpendicular to at least one other split. In another embodiment, at least two splits may be parallel to each other. Both the consolidated and bifurcated regions are 'monolithic' in the sense that they are comprised of a single piece of woven fabric and not a plurality of thinner discrete plies. The single consolidated region is approximately 2 times the thickness of each bifurcated region, and each bifurcated region is approximately ½ the thickness of the consolidated region.

In a second embodiment, that may also be described with reference to the FIG. 6, a plurality of plies forms the consolidated region 220. These plurality of plies may be split into three different bifurcated regions that can then be used to form the portions of an airfoil. This is detailed later below.

First, the single ply that forms consolidated region 220 and that is split into three different bifurcated regions (that define the airfoil, the inner diameter platform and the outer diameter platform) will be described. The consolidated region 220 comprises a single ply woven as one thick region. Shown in the upper right hand corner of FIG. 6 is a clock to provide directionality to the reader. Shown on the clock are 3 directions—a 12 o'clock direction pointing due north, a 3 o'clock direction pointing due east and a 6 o'clock direction pointing due south.

The consolidated region 220 is largely rectangular in shape, and each bifurcated region originates on an edge of the consolidated region. When viewed from the side, the first airfoil bifurcation originates on the 3 o'clock edge 302 with a second bifurcation (a pressure side bifurcation) that occurs at edge 306 and a third bifurcation (a suction side bifurcation) that occurs at edge 304. Each airfoil bifurcation extends toward the leading edge of the airfoil. The airfoil suction side bifurcation 204 and the airfoil pressure side bifurcation 202 occur at edge 302. The sum of the thicknesses of each of the bifurcated regions 204 and 202 equals the total thickness of the consolidated region 220.

In this manner, the single consolidated region 220 is bifurcated into two thinner regions at three different orthogonal locations. The bifurcations at the inner diameter (at the 6 o'clock direction) and the outer diameter (at the 12 o'clock direction) of the airfoil are detailed below.

The outer diameter platform 80 (see FIGS. 5 and 8) bifurcation originates on the 12 o'clock edge 304 of the consolidated region 220, and the inner diameter platform 78 (See FIGS. 5 and 8) bifurcation originates at the 6 o'clock edge 306 of the consolidated region 220. The inner diameter platform 78 and the outer diameter platform 80 bifurcations both extend away from the airfoil in the circumferential direction.

The inner diameter platform 78 is formed by the bifurcated regions 210 (which is the inner diameter pressure side bifurcation) and 212 (which is the inner diameter suction side bifurcation) which diverge from the consolidated region 220 at edge 306. The outer diameter platform 80 is formed by the bifurcated regions 208 (which forms the outer diameter suction side bifurcation) and 206 (which forms the outer diameter pressure side bifurcation) at edge 304. Surface 208 has a height $h_2$ and width $a_2$. The width of surface 208 may be the same as that of the consolidated region. Each consolidated region is twice the thickness of each bifurcated region. The consolidated and bifurcated regions comprise a single piece of woven fabric and not a plurality of thinner discrete plies. The consolidated regions and the bifurcated regions can therefore be considered to be monolithic (manufactured from a single indivisible woven fabric without cuts or divisions).

In this next embodiment, the consolidated and bifurcated regions each comprise a plurality of plies, with the plies that form the consolidated region being divided to form the bifurcated regions. FIG. 6 in conjunction with FIG. 7 depicts one embodiment of the triple bifurcated ply 200 that comprises a plurality of plies in a consolidated region 220. The number of plies used in the consolidated region 220 can be 2 to 200, preferably 5 to 100, and more preferably 10 to 50.

In this embodiment, a portion of the consolidated region 220 is split in 3 different directions. In an embodiment, each of the splits is mutually perpendicular to at least one another split. In an embodiment, all three splits are mutually perpendicular to at least one other split. In another embodiment, at least two splits may be parallel to each other. It is also possible for each split to be oriented at an angle other than 90 degrees to at least one other split. For example, at least one split can be oriented at an angle of 30 to 150 degrees, preferably 60 to 120 degrees to another split. A split is a location at which a plurality of plies extending in a first direction split off into 2 pluralities of plies extending into two different directions at least one of which is different from the original direction.

A first split into two surfaces 202 and 204 that defines the pressure side and suction side of the airfoil 82 and 84 respectively (see FIG. 5) is made in a direction perpendicular to the 3 o'clock direction along boundary 302. The surface 202 diverges from the consolidated region at boundary 302 to form the pressure side of the airfoil 82 at the trailing edge 70 (see FIG. 5). The surfaces 202 and 204 may or may not have the same height. For example, surface 202 in the FIG. 5 is depicted as having a height $h_1$ and width $a_1$. Surface 204 may have a height $h_3$ (not shown) that is the same or different from height $h_1$. Similarly, its width may be greater of smaller than the width $a_1$. In this manner, the plies that are part of the first split may not all have the same height. In an embodiment, the heights can be selected to be different so as to perform a space filling function as may be seen in the region between surfaces 82 and 94 in the FIG. 7. FIG. 7 is detailed below.

Figure 7:
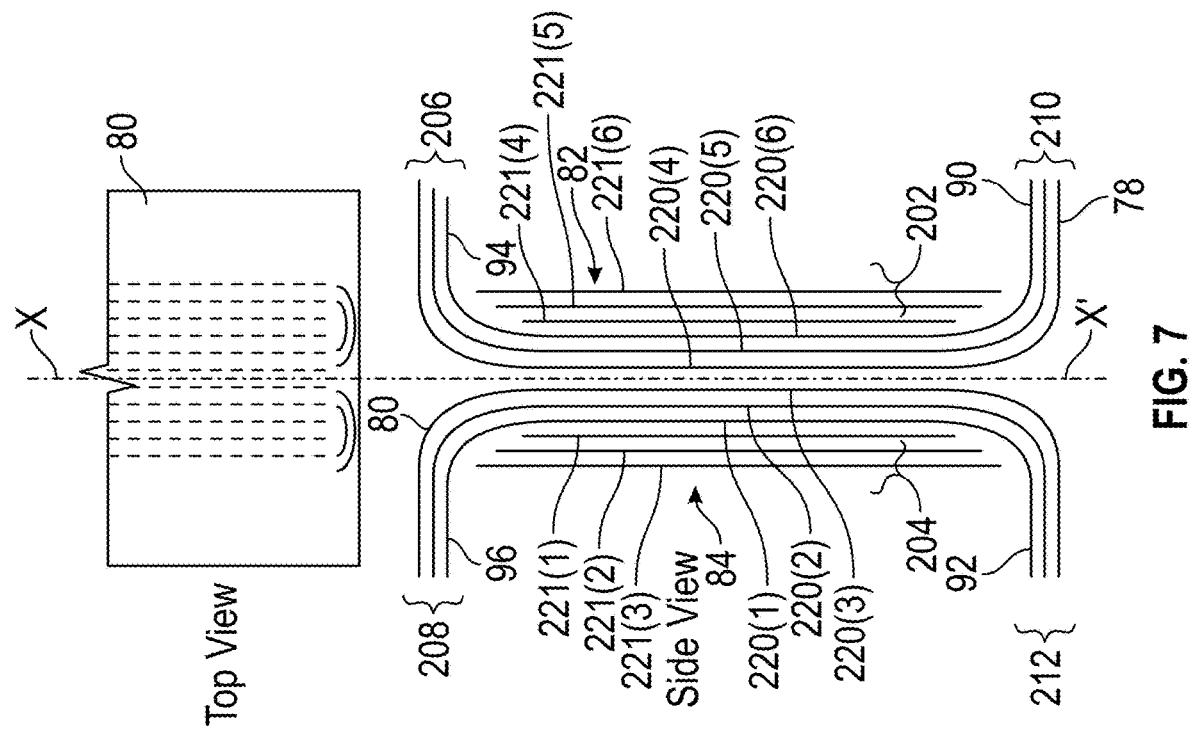
FIG. 7 is an exemplary depiction of the use of a triple bifurcated ply in manufacturing an airfoil.

With reference to the FIGS. 5, 6 and 7, a second split into two additional surfaces 210 and 212 that defines the pressure side and suction side of the inner diameter platform 78 respectively is made in a line 306 that is perpendicular to the 6 o'clock direction. This split occurs at the point where the airfoil 66 meets with the platform 78. The surface 210 is oriented along the pressure side 82 of the inner diameter platform 78 (which is indicated by numeral 90), while the surface 212 is oriented along the suction side 84 of the inner diameter platform 78 (which is indicated by numeral 92).

With reference once again to the FIGS. 5, 6 and 7, a third split into two additional surfaces 206 and 208 that defines the pressure side and suction side of the outer diameter platform 80 is made along a line 304 perpendicular to the 12 o'clock direction. This split occurs at the point where the airfoil 66 meets with the outer diameter platform 80. The surface 210 is oriented along the pressure side 82 of the outer diameter platform 80 (which is indicated by numeral 94), while the surface 212 is oriented along the suction side 84 of the outer diameter platform 80 (which is indicated by numeral 96).

FIG. 7 depicts a side view and top view of an exemplary portion of the airfoil when manufactured with the triple bifurcated ply 200 of the FIG. 6. The consolidated region 220 comprises 6 plies 220(1), 220(2), 220(3), 220(4), 220(5) and 220(6). While the FIG. 7 details an equal number of plies to the left and right of the axis XX', this may not necessarily be the case. The number of plies to the left of the axis XX' may be the same or different from the number of plies to the right of the axis XX'. In other words, the number of plies on either side of the axis may be symmetrically distributed or asymmetrically distributed. In another embodiment, the splits may be symmetrical or asymmetrical about a given plane or about an axis. In an embodiment, the innermost ply is directly adjacent to the central airfoil axis XX' to form a solid airfoil.

These plies are split in the vertical direction at boundary 320 (see FIG. 6) to produce 3 surfaces 221(1), 221(2) and 221(3) that extend back towards the consolidated region 220 on the suction side 84 and 3 surfaces 221(4), 221(5) and 221(6) that extend back towards the consolidated region 220 on the pressure side 82. It may be seen that the ply surfaces 221(1), 221(2) and 221(3) as well as the ply surfaces 221(4), 221(5) and 221(6) are not all the same height, but have varying heights which are determined by surface curvature at the inner diameter and the outer diameter of the airfoil. These ply surface heights can be tailored depending upon the need to fill space in the airfoil. The number of plies forming the consolidated region and the number of split plies (as a fraction of the number of plies that form the consolidated region) can be varied depending upon airfoil thickness, the thickness of the trailing edge or the leading edge and the need for space filling utility.

Three of the plies 220(1), 220(2), and 220(3) from the consolidated region 220 are split towards the suction side 84 at both the inner diameter 78 and the outer diameter 80 of the airfoil to form surfaces 92 and 96 respectively. Three of the plies 220(4), 220(5) and 220(6) from the consolidated region 220 are split towards the pressure side 82 at both the inner diameter 78 and the outer diameter 80 of the airfoil to form surfaces 90 and 94 respectively. The length and width of the plies that form the consolidated region may all be the same or different from each other depending upon the application. The number of plies split towards the suction side may be the same or different from the number of plies split towards the pressure side. In another embodiment, the number of plies split towards the suction side on the inner diameter may be the same or different from the number of plies split towards the pressure side on the inner diameter. In yet another embodiment, the number of plies split towards the suction side on the outer diameter may be the same or different from the number of plies split towards the pressure side on the outer diameter. In other words, as noted above, the number of plies may be symmetrically distributed about or asymmetrically distributed about an axis that defines the pressure side and suction side of the airfoil. The splits may also be symmetrically or asymmetrically distributed about an axis that defines the pressure side and suction side of the airfoil.

Figure 8:
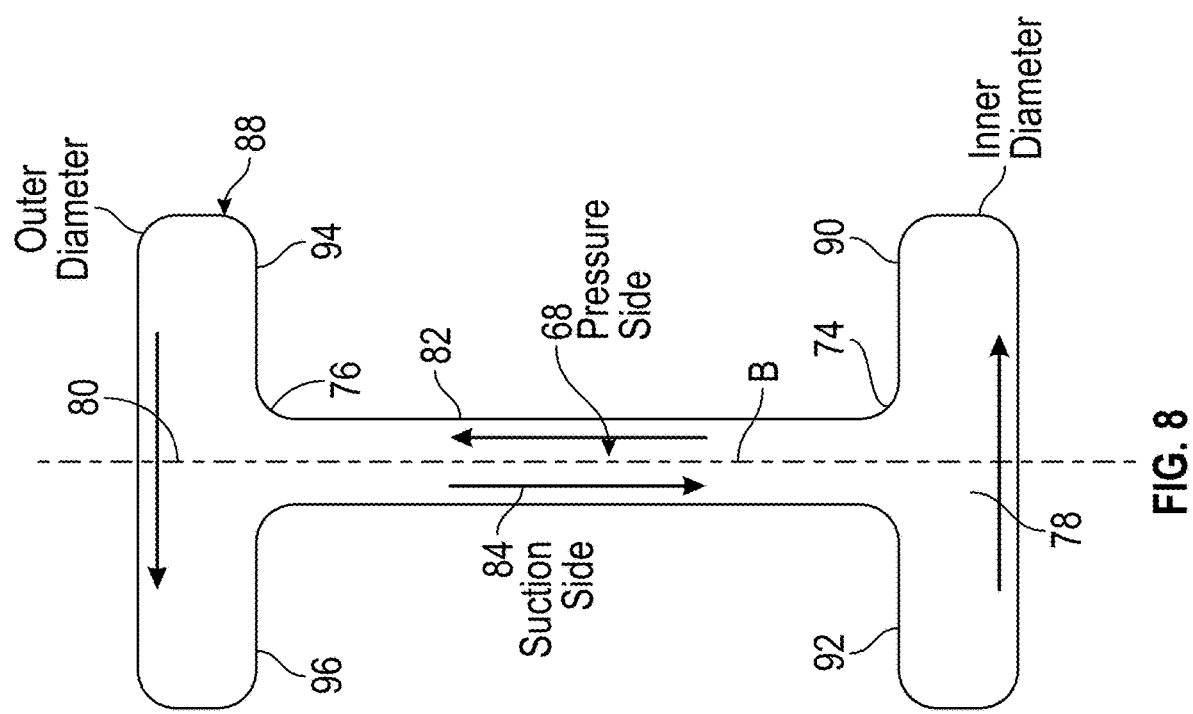
FIG. 8 is an exemplary depiction of an airfoil that contains the bifurcated ply of the FIG. 7 wrapped in a CMC fiber ply.

With reference to FIG. 8, at least one CMC ply 88 may optionally be wrapped in the "I" shape to arrange the structural fibers (See FIG. 7) in the "I" shape to form the pressure side 82, the platform segment 78, the suction side 84 and the platform segment 80 in a continuous manner. A first portion of the CMC ply 88 defines the airfoil portion 68 while transverse portions of the CMC ply 88 form the platform segments 78, 80. The first portion forms the pressure side 82 and the suction side 84 of the airfoil portion 68. At least a portion of the innermost CMC plies 88 may be spaced from or directly adjacent to a central airfoil axis B (see FIGS. 3 and 4) to form either a solid or cored airfoil portion 68.

In the disclosed non-limiting embodiment, the platform segments 78, 80 are chevron-shaped to provide a complementary geometry for abutting edge engagement of each adjacent platform segment to define the inner and outer core gas path (FIG. 3). That is, the CMC airfoils 66 are assembled in an adjacent complementary manner to form a ring of airfoils which are further wrapped with a CMC outer ring 100 and a CMC inner ring 102 about the multiple of the respectively adjacent platform segments 78, 80 to form full hoops (FIG. 3). It should be understood that appropriate twist and the like may be readily included and is not shown in the schematic views of FIGS. 7 and 8.

In one embodiment, in one method of manufacturing the airfoil, at least two plies are first made into a preform. The plies are then split into at least 3 bifurcated directions to form an initial perform. The bifurcated directions define the pressure side, the suction side, the inner diameter and outer diameter of the airfoil. Other plies (some of which may be split and some of which may not be split) are added to the preform (to form a final preform) to further define the airfoil and provide it with the right dimensions. The preform may then be subjected to chemical vapor infiltration, polymer infiltration pyrolysis, melt infiltration, or the like, or a combination thereof to form the ceramic matrix composite.

Suitable ceramics for use in the ceramic composite matrix comprise silicon carbide (SiC), alumina ($Al_2O_3$), mullite ($Al_2O_3$—$SiO_2$), or a combination thereof. Suitable fibers for use in the ceramic matrix composite are SiC, $Al_2O_3$, BN, $B_4C$, $Si_3N_4$, $MoSi_2$, $SiO_2$, SiOC, SiNC, and/or SiONC.

By integrating the aft portions of the ID and OD platforms and bifurcated airfoil plies into one continuous shape, structural continuity in the region is maintained and the large voids created by other conventional approaches are significantly limited or altogether removed. This single piece of triply bifurcated fabric can be incorporated into the laminate using normal techniques, and in doing so, eliminates numerous small details and processing steps.

While the invention has been described with reference to some embodiments, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A ceramic matrix composite airfoil comprising:
a triple bifurcated ply that defines a suction side, an outer platform, a pressure side and an inner platform of the airfoil, wherein the triple bifurcated ply comprises at least one ply that comprises a consolidated region, wherein the consolidated region is split into two bifurcated regions in three locations in three different directions.

2. The composite of claim 1, wherein the consolidated region comprises a plurality of plies in addition to the at least one ply.

3. The composite of claim 2, wherein an innermost ply of the plurality of plies is directly adjacent a central airfoil axis to form a solid airfoil.

4. The composite of claim 1, wherein the three different directions are at angles of 30 to 150 degrees to one another.

5. The composite of claim 1, wherein at least one split is oriented at right angles to another split.

6. The composite of claim 1, wherein the three different directions are all at right angles to at least one other direction.

7. The composite of claim 1, wherein the splits are symmetrical about a plane or an axis.

8. The composite of claim 1, wherein the splits are asymmetrical about a plane or an axis through the consolidated region.

9. The composite of claim 1, wherein at least one of the bifurcations defines the suction side and the pressure side of the airfoil.

10. The composite of claim 1, wherein at least one of the bifurcations defines the inner diameter of the airfoil.

11. The composite of claim 1, wherein at least one of the bifurcations defines the outer diameter of the airfoil.

12. The composite of claim 1, wherein at least two of the directions are parallel to one another and wherein at least two of the directions are perpendicular to the other direction.

13. The composite of claim 1, wherein the consolidated region is two times as thick as each bifurcated region.

14. A method for manufacturing a ceramic matrix composite airfoil comprising:
- splitting one or more consolidated plies into two bifurcated regions in at least three different directions to form an initial preform;
- optionally add additional plies to the initial preform to form a final preform; where the bifurcated directions define the pressure side, the suction side, the inner diameter and outer diameter of the airfoil; and
- subjecting the final preform to chemical vapor infiltration, polymer infiltration pyrolysis, melt infiltration, or a combination thereof to form the ceramic matrix composite.

15. The method of claim 14, wherein at least two of the directions are parallel to one another and wherein at least two of the directions are perpendicular to the other direction.

16. The method of claim 15, wherein the three different directions are at angles of 30 to 150 degrees to one another.

17. The composite of claim 14, wherein an innermost ply of the one or more consolidated plies is directly adjacent a central airfoil axis to form a solid airfoil.

18. The method of claim 14, wherein at least one split is oriented at right angles to another split.

19. The method of claim 14, wherein the three different directions are all at right angles to at least one other direction.

20. The method of claim 14, wherein at least one of the bifurcations defines the suction side and the pressure side of the airfoil.

* * * * *